United States Patent [19]

Finkl

[11] Patent Number: 5,538,563
[45] Date of Patent: Jul. 23, 1996

[54] SOLAR ENERGY CONCENTRATOR APPARATUS FOR BIFACIAL PHOTOVOLTAIC CELLS

[76] Inventor: Anthony W. Finkl, 445 E. Royal Flamingo Dr., Sarasota, Fla. 34236

[21] Appl. No.: 384,297

[22] Filed: Feb. 3, 1995

[51] Int. Cl.[6] .................................................. H01L 31/052
[52] U.S. Cl. .................................................. 136/246
[58] Field of Search .................................................. 136/246

[56] References Cited

U.S. PATENT DOCUMENTS

| | | | |
|---|---|---|---|
| 3,278,811 | 10/1966 | Mori | 136/244 |
| 3,490,950 | 1/1970 | Myer | 136/246 |
| 4,132,221 | 1/1979 | Orillion | 126/572 |
| 4,132,222 | 1/1979 | Roark | 126/657 |
| 4,169,738 | 10/1979 | Luque | 136/246 |
| 4,239,034 | 12/1980 | Niedermeyer | 126/662 |
| 4,249,520 | 2/1981 | Orillion | 126/651 |
| 4,311,132 | 1/1982 | van Kuijk | 126/655 |
| 4,316,448 | 2/1982 | Dodge | 126/600 |
| 4,397,302 | 8/1983 | Moravnik | 126/687 |
| 4,398,053 | 8/1983 | Orillion | 136/248 |
| 4,471,763 | 9/1984 | Moravnik | 126/666 |
| 4,513,734 | 4/1985 | Butler | 126/683 |
| 4,800,868 | 1/1989 | Appeldorn et al. | 126/692 |

FOREIGN PATENT DOCUMENTS

| | | | |
|---|---|---|---|
| 60-178671 | 9/1985 | Japan | 136/246 |

*Primary Examiner*—Aaron Weisstuch
*Attorney, Agent, or Firm*—Baker & McKenzie

[57] ABSTRACT

A solar energy concentrator apparatus which simultaneously focuses incident solar radiation upon both sides of a bifacial photovoltaic cell. The concentrator apparatus includes a corrugated-shaped reflector sheet and an open-grid support structure. Bifacial photovoltaic cells are held in place by the open-grid support structure and are mounted either horizontally or vertically with respect to the plane of the reflector sheet. The cells are specifically positioned so as to receive solar radiation—either directly or by reflection—at 90° angles to their surfaces. The system is designed to operate in conjunction with any one of the tracking systems currently available in the industry whereby the apparatus is maintained at a 90° angle with respect to the angle of incidence of the sun.

3 Claims, 2 Drawing Sheets

SOLAR ENERGY CONCENTRATOR APPARATUS FOR BIFACIAL PHOTOVOLTAIC CELLS

This invention relates to solar energy concentrator systems which serve to maximize the amount of incident solar radiation that is received by a collector element.

BACKGROUND OF THE INVENTION

Over the past two decades or so, as the desire to utilize solar energy as a viable source of power has grown, a great many solar energy concentrator systems have been developed. The design of these systems range from the relatively simple, such as a flat-plate collector array which tracks the path of the sun, to the considerably more complex. Indeed, the advent of the bifacial photovoltaic cell (or systems which place single-sided cells back-to-back) has led to an even greater variety of concentrator systems that attempt to maximize the amount of solar energy which strikes both sides of a collector element simultaneously. Many of the systems which exist today, however, are either wholly inadequate to adapt to a two-sided collector element, or have proven to be so complex that they necessarily carry high initial costs and substantial maintenance expenses.

The first category of related prior art includes flat plate collector element systems which remain perpendicular to the sun's angle of incidence through the use of tracking systems. Indeed, there are a number of widely-accepted tracking systems now employed by this industry since they have proven to be quite reliable and efficient in their operation. However, the flat-plate collector designs have their drawbacks in that only one side of a collector element may receive incident solar radiation at a time. Accordingly, these systems would be clearly inadequate with regard to the efficient operation of bifacial photovoltaic cells.

Other prior art designs in this industry include those which employ curved reflector surfaces. While such a design may improve the efficiency with which both sides of a bifacial photovoltaic cell receive incident solar radiation, it inevitably requires a much higher manufacturing cost as well.

Additional designs which have been disclosed include those which employ multiple, relatively large reflector surfaces for each individual collector element. Other systems incorporate an additional transmissive material adjacent the collector element for optional internal refraction. Still others require a complex array of pyramidal reflecting surfaces to surround a collector element and precisely focus the incident solar radiation. All of these systems, however, are fairly complex designs which carry substantial manufacturing costs as well as significant installation/replacement costs.

What is needed in this field of art is a relatively simple, lightweight, yet rigid solar energy concentrator apparatus which maximizes the amount of solar radiation received by both sides of a bifacial photovoltaic cell or the collector elements of two single-sided cells placed back-to-back.

SUMMARY OF THE INVENTION

Accordingly, the present invention provides a solar energy concentrator system comprising a lightweight cell support structure connected to a corrugated reflector surface which is maintained at a 90° angle to the sun's angle of incidence by any one of the industry-standard tracking systems available on the market today. The cell support structure maintains the position of a bifacial photovoltaic cell array in relation to the corrugated reflector surface whereby both sides of such collector element receive either direct or reflected solar radiation at a 90° angle. The reflective surface is of a simple, one-piece design comprising multiple V-shaped sections having internal angles of 90°. The cell support structure is an open-grid type which connects the upper and lower points of the corrugated reflector surface in order to maintain the proper radiation-receiving position of the bifacial photovoltaic cells.

The present invention distinguishes itself from the prior art by providing a relatively low-cost solar energy collector apparatus which employs the efficient operation of an industry-standard tracking system. This system avoids the relatively complex designs normally associated with bifacial solar energy collector devices and takes advantage of existing tracking technology which has proven quite effective.

It is therefore a general object of the present invention to improve bifacial photovoltaic cell efficiency by simultaneously exposing both faces of the cell to the rays of the sun at 90° angles.

More specifically, it is an object of the present invention to provide a very light, yet rigid structure which operates in conjunction with an industry-standard tracking system to accept incident solar radiation at 90° angles to both sides of a bifacial photovoltaic cell.

Another object of the present invention is to minimize the manufacturing, installation, and maintenance costs associated with solar energy concentrator systems while also increasing the savings associated with improved cell conversion capacity.

In another one of its aspects, it is an object of the present invention to allow water to circulate through the bottom channels of the corrugated reflector surface to both cool the photovoltaic cells, and to provide warm water for any number of desired end users.

Further objects and advantages of the invention will become apparent to those of ordinary skill in the pertinent art upon review of the following detailed description, accompanying drawing, and appended claims.

DETAILED DESCRIPTION OF THE DRAWING

Figure 1:
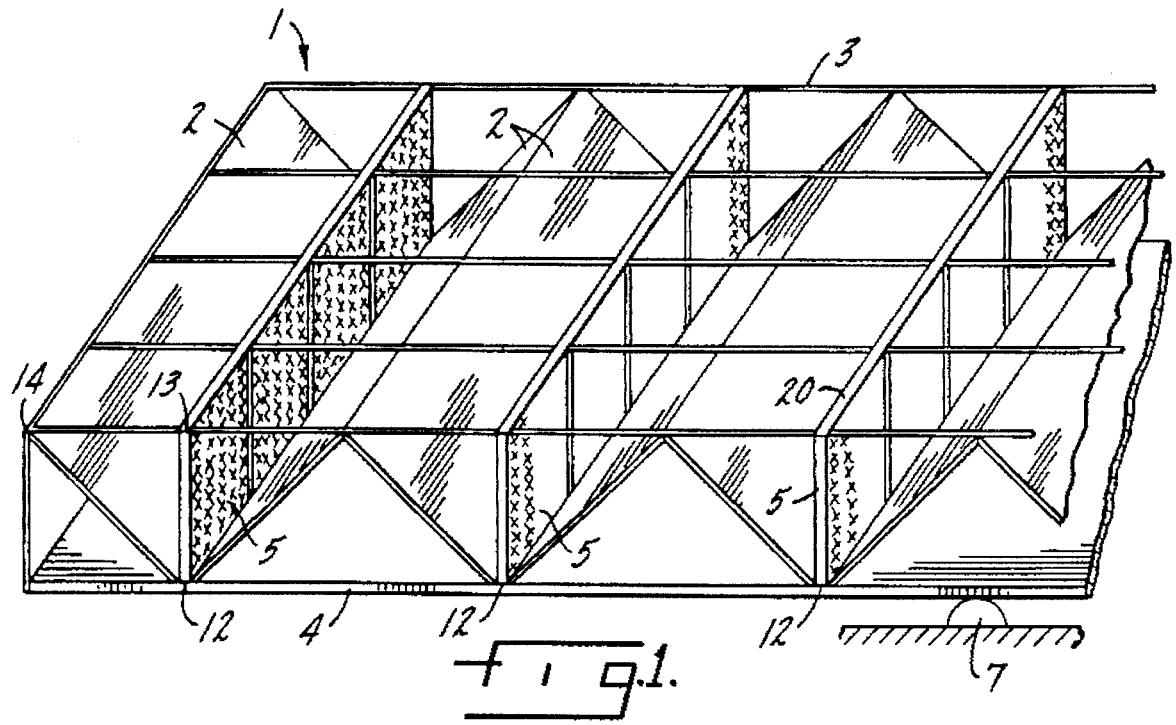
FIG. 1 is a perspective view of one embodiment of the invention wherein the photovoltaic cells are mounted in a vertically-oriented position.

FIG. 1 discloses a solar energy concentrator apparatus, indicated generally at 1, including a corrugated reflector sheet 2, an open-grid support structure 3, a base plate 4, a pivot means 7, and an array of bifacial photovoltaic cells 5 mounted in a vertically-oriented position. Rigidity of the concentrator apparatus 1 is enhanced by securing the corrugated reflector sheet 2 to the upper surface of the base plate 4 along bottom points 12.

The open-grid support structure 3, as indicated in FIG. 1, is comprised of numerous individual bracket members 20 which serve to secure the bifacial photovoltaic cells 5 in their vertically-oriented position with respect to both the corrugated reflector sheet 2 and the base plate 4. Bracket members 20 are arranged at 90° angles with respect to each other and are affixed to the corrugated reflector sheet 2 at the sheet's bottom points 12 and top edges 14. Bracket members 20 intersect at vertical peaks 13 of the bifacial photovoltaic cells 5 and ensure that the cells are securely maintained in their proper position. Pursuant to the present invention, a pivot means 7 is also provided to allow the concentrator apparatus 1 to operate in conjunction with one of the many industry-standard tracking systems available on the market. Pivot means 7 permits the apparatus to follow the path of the sun and remain at a right angle with respect to the rays of incident solar radiation.

Figure 2:
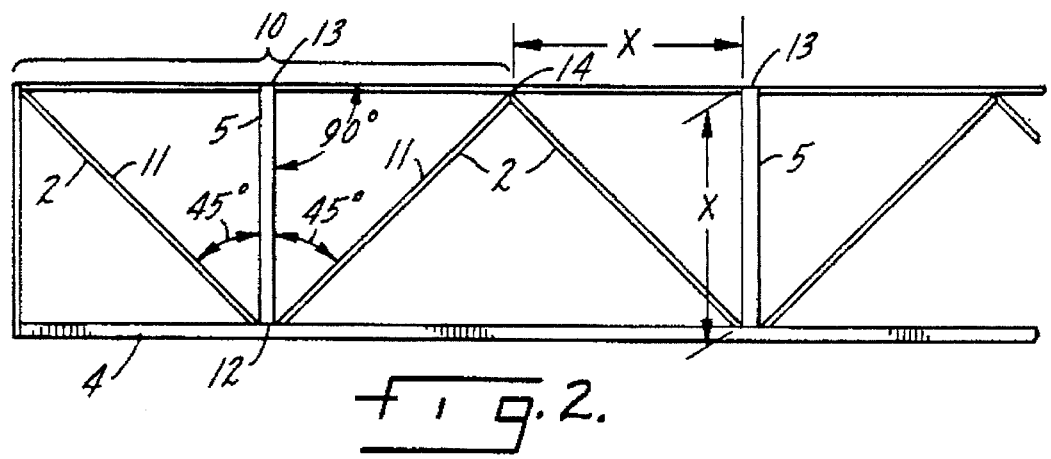
FIG. 2 is a side sectional view of the embodiment shown in FIG. 1.

Turning now to FIG. 2, a side sectional view of the embodiment disclosed in FIG. 1 is shown whereby the exact position of the bifacial photovoltaic cells 5 within each V-shaped concentrator section 10 of the corrugated reflector sheet 2 is indicated. Each bifacial photovoltaic cell 5 bisects the internal 90° angle of its respective V-shaped concentrator section 10 resulting in a 45° angle between each face of the cell and the adjacent inward facing surface 11 of the concentrator section 10. Each bifacial photovoltaic cell 5 extends vertically upward from a bottom point 12 of the reflector sheet 2 to a vertical peak 13. This bottom point 12 is constructed so as to create a watertight seal to allow water to circulate along the bottom edges of the bifacial photovoltaic cells 5. The vertical height of each cell 5, designated by the letter X in FIG. 2, is equal to the horizontal distance between the vertical peak 13 of the cell and an adjacent top edge 14 of the corrugated reflector sheet 2. Inward facing surfaces 11 are of a reflective material having the capability to substantially completely reflect incident solar radiation.

Figure 3:
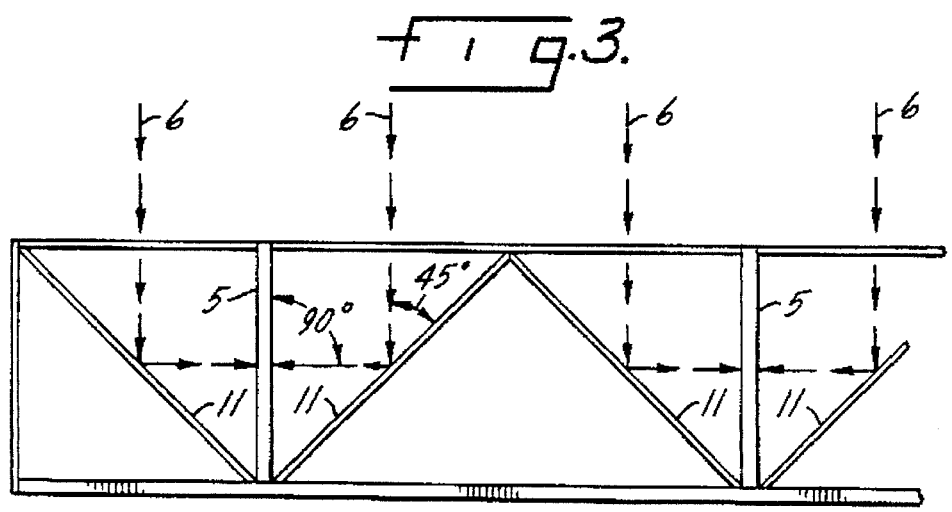
FIG. 3 is a side sectional view of the embodiment shown in FIG. 1, illustrating both the angles of incidence and the angles of reflection of the incident solar radiation with respect to both the reflective surfaces and the vertically-oriented photovoltaic cells.

FIG. 3 illustrates the angles of reflection of incident solar radiation 6 with respect to both the inward facing surfaces 11 and the vertically-positioned bifacial photovoltaic cells 5. In accordance with the present invention, the entire concentrator apparatus 1 is intended to remain substantially perpendicular to the rays of incident solar radiation 6 during operation. This, of course, will be accomplished through the associated use of one of the many industry-standard tracking systems available in the market. Accordingly, the incident solar radiation 6 will reflect off of the inward facing surfaces 11 and subsequently strike the bifacial photovoltaic cells 5 at a 90° angle. Since the vertical height of the inward facing surfaces 11 is equal to the vertical height of the bifacial photovoltaic cells 5, the total surface area of both sides of the cell will be activated by the rays of incident solar radiation 6.

Figure 4:
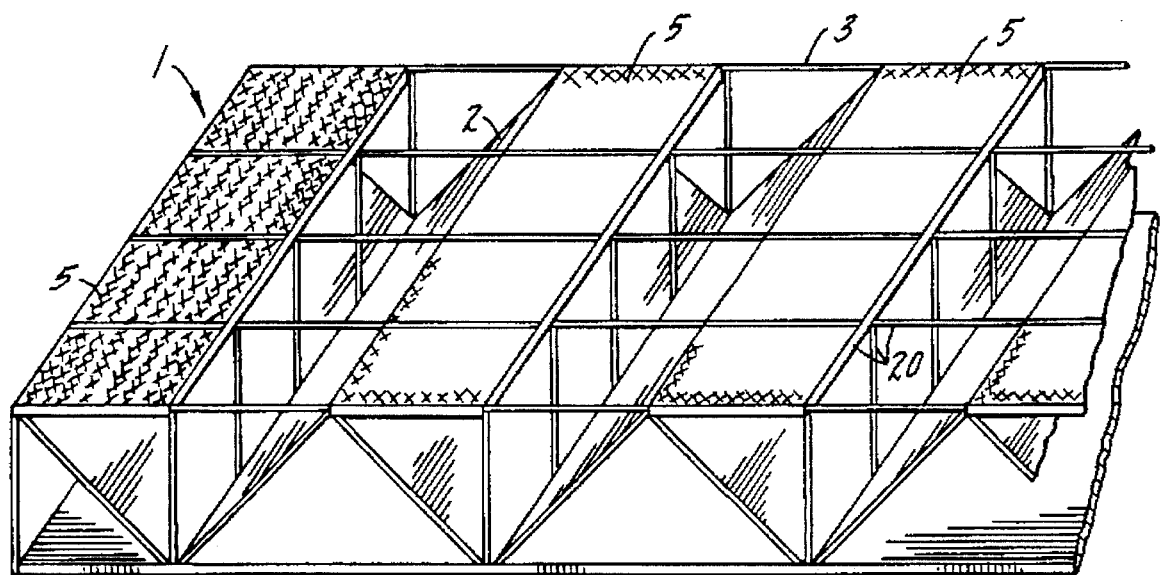
FIG. 4 is a perspective view of another embodiment of the invention wherein the photovoltaic cells are mounted in a horizontally-oriented position.

The embodiment of the invention shown in FIG. 4 illustrates an optional configuration of the solar energy concentrator apparatus, indicated generally at 1, whereby the bifacial photovoltaic cells 5 are mounted in a horizontal position. This configuration does not require any changes to the arrangement of the corrugated reflector sheet 2, the open-grid support structure 3, or the base plate 4. Indeed, the bracket members 20 are designed to accept and secure an array of bifacial photovoltaic cells 5 in either a horizontal or vertical position without any additional structural changes.

Figure 5:
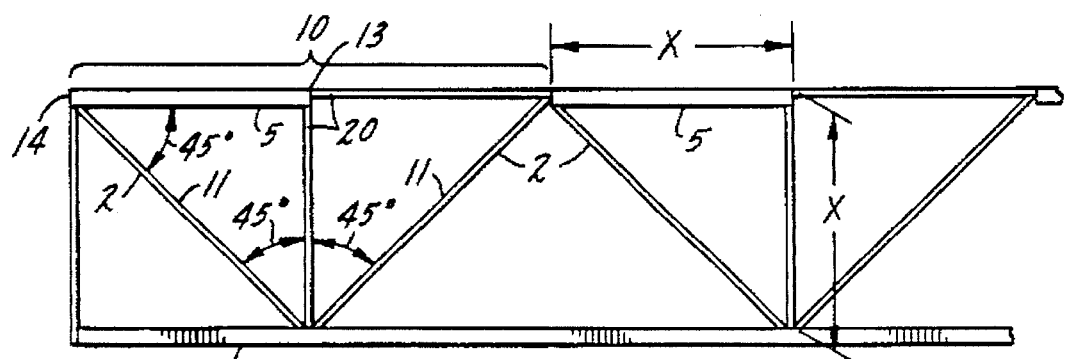
FIG. 5 is a side sectional view of the embodiment shown in FIG. 4.

FIG. 5 is a side sectional view of the embodiment shown in FIG. 4 and illustrates the exact placement of a horizontally-positioned bifacial photovoltaic cell 5 within a single V-shaped concentrator section 10. The cells are supported by the bracket members 20 and extend horizontally from a top edge 14 of the V-shaped concentrator section 10 to the vertical peak point 13. The cells are adjacent to only one inward facing point 13. The cells are adjacent to only one inward facing surface 11 of each V-shaped concentrator section 10 and are disposed at a 45° angle thereof. This arrangement leaves intact the unoccupied, horizontal space which is adjacent to this bifacial photovoltaic cell 5 and immediately above the other inward facing surface 11 of this V-shaped concentrator section 10.

Figure 6:
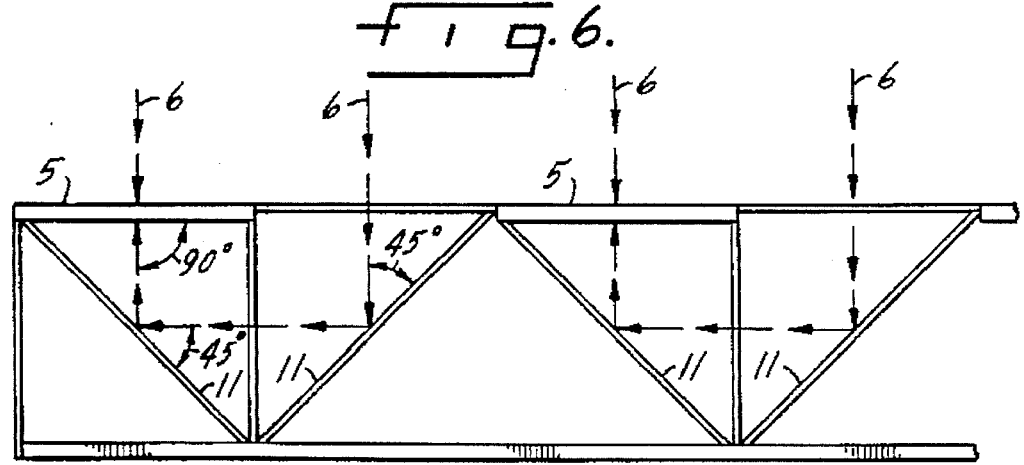
FIG. 6 is a side sectional view of the embodiment shown in FIG. 4, illustrating both the angles of incidence and the angles of reflection of the incident solar radiation with respect to both the reflective surfaces and the horizontally-oriented photovoltaic cells.

Turning to FIG. 6, one can observe the reflected angles of incident solar radiation 6 with respect to the inward facing surfaces 11 and horizontally-mounted bifacial photovoltaic cells 5. Following this design, incident solar radiation 6 will again strike both surfaces of the bifacial photovoltaic cell 5 at a 90° angle. The top surface of the cell accepts the sun's rays directly, while the bottom surface receives them after they have been reflected off of both inward facing surfaces 11 associated with that V-shaped concentrator section 10. Specifically, incident solar radiation 6 passes through the unoccupied, horizontal space which is adjacent the bifacial photovoltaic cell 5 and strikes the corresponding inward facing surface 11. The rays are reflected at 90° toward the opposite inward facing surface 11 where they are subsequently reflected another 90° to perpendicularly strike the bottom surface of the bifacial photovoltaic cell 5.

While the present invention has been illustrated in some detail according to the preferred embodiment shown in the foregoing drawings and description, it will be apparent to those skilled in the pertinent art that variations and equivalents may be made within the spirit and scope of that which has been expressly disclosed. Accordingly, it is intended that the scope of the invention be limited solely by the scope of the hereafter appended claims and not by any specific wording in the foregoing description.

I claim:

1. A solar energy concentrator apparatus for simultaneously directing incident solar radiation to the two collector faces of a bifacial photovoltaic cell means, which comprises:

(a) a reflector sheet, said sheet defining a plurality of generally equally-sized and generally adjoining V-shaped concentrator sections, each concentrator section having a 90-degree, upward-facing internal angle and two inward-facing surfaces adjacent to said internal angle, said inward-facing surfaces being reflective of incident solar radiation and adapted to be oriented at a 45-degree angle to the sun's rays;

(b) a substantially planar supporting base plate having a length and width substantially equal to those of said reflector sheet, said sheet being mounted to said base plate whereby said V-shaped sections are aligned in parallel relation to each other and the bottom apex of each V-shaped section is secured to the upper surface of said base plate;

(c) at least one bifacial photovoltaic cell means, comprising either a bifacial photovoltaic cell or two single-sided photovoltaic cells placed back-to-back; and (d) an open-grid support structure consisting of horizontal bracket members arranged in parallel fashion to said base plate and further arranged in equally-spaced rows and columns to form a plurality of substantially square cell frames, each of said frames capable of securely accommodating one said bifacial photovoltaic cell means, said structure further comprising vertical brackets, an upper end of each said vertical bracket connected to an intersecting point of said horizontal bracket members and a lower end of each said vertical bracket connected to said base plate at a point where said bottom apexes are also secured to said base plate, an area defined between adjacent vertical bracket members capable of securely accommodating one said bifacial photovoltaic cell means, said structure supporting each of said bifacial photovoltaic cell means in one of two ways: 1) in a substantially vertical plane which bisects said internal angles and is parallel to the sun's rays, wherein a bottom edge of each said bifacial photovoltaic cell means nests at a bottom apex of a V-shaped concentrator section and a vertical height of said inward-facing surface is substantially equal to a height of said bifacial photovoltaic cell means as installed; or 2) in a substantially horizontal plane, which includes a vertical apex of one said inward-facing surface and is perpendicular to the sun's rays, wherein one edge of said bifacial photovoltaic cell means is joined to said vertical apex and an opposite edge of said bifacial photovoltaic cell means is inwardly positioned from said vertical apex at a point in substantial vertical alignment with said bottom apex of respective V-shaped concentrator section.

2. The solar energy concentrator apparatus of claim 1, further comprising pivot means whereby said base plate is rotated to remain perpendicular to the angle of incidence of the incoming solar radiation.

3. The solar energy concentrator apparatus of claim 1, whereby said bottom apexes of V-shaped concentrator sections form watertight seals so as to allow water to circulate along said bottom edges of said cells.

* * * * *